US008986920B2

(12) United States Patent
Liu

(10) Patent No.: US 8,986,920 B2
(45) Date of Patent: Mar. 24, 2015

(54) METHOD FOR FORMING QUARTER-PITCH PATTERNS

(71) Applicant: Hung-Jen Liu, New Taipei (TW)

(72) Inventor: Hung-Jen Liu, New Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 197 days.

(21) Appl. No.: 13/674,950

(22) Filed: Nov. 13, 2012

(65) Prior Publication Data

US 2014/0134522 A1    May 15, 2014

(51) Int. Cl.
*G03F 7/26* (2006.01)
*G03F 1/76* (2012.01)

(52) U.S. Cl.
CPC .................................. *G03F 1/76* (2013.01)
USPC ........... 430/311; 430/314; 430/313; 430/330; 430/315

(58) Field of Classification Search
CPC ............... H01L 21/31144; H01L 21/0273; H01L 21/76816; H01L 21/00; H01L 21/0337; H01L 21/0338; H01L 21/0332; G03F 7/0035; G03F 7/40; G03F 7/095
USPC .................. 430/315, 313, 330, 314
See application file for complete search history.

(56) References Cited

U.S. PATENT DOCUMENTS

| 7,611,980 B2 * | 11/2009 | Wells et al. .................... 438/597 |
| 2004/0166447 A1 * | 8/2004 | Chang et al. .................. 430/324 |
| 2009/0246958 A1 | 10/2009 | Burns et al. | |

FOREIGN PATENT DOCUMENTS

TW           200830358           7/2008

OTHER PUBLICATIONS

"Office Action of Taiwan Counterpart Application", issued on Dec. 23, 2014, p1-p4, in which the listed references were cited.

* cited by examiner

*Primary Examiner* — Caleen Sullivan
(74) *Attorney, Agent, or Firm* — Jianq Chyun IP Office

(57) ABSTRACT

A method for forming quarter-pitch patterns is described. Two resist layers are formed. The upper resist layer is defined into first patterns. A coating that contains or generates a reactive material making a resist material dissolvable is formed over the lower resist layer and the first patterns. The reactive material is diffused into a portion of each first pattern and portions of the lower resist layer between the first patterns to react with them. The coating is removed. A development step is performed to remove the portions of the first patterns and the portions of the lower resist layer, so that the lower resist layer is patterned into second patterns. Spacers are formed on the sidewalls of the remaining first patterns and the second patterns. The remaining first patterns are removed, and portions of the second patterns are removed using the spacers on the second patterns as a mask.

9 Claims, 2 Drawing Sheets

METHOD FOR FORMING QUARTER-PITCH PATTERNS

BACKGROUND OF THE INVENTION

1. Field of Invention

This invention relates to a method for forming quarter-pitch patterns.

2. Description of Related Art

The resolution in a photolithography process depends on the wavelength of the exposure light, the numerical aperture (NA) of the optical system and the design of the photomask. When the resolution needed by an array of patterns exceeds the resolution of the lithographic system, e.g., in a case of forming the gate line array of a high-density memory like a DRAM of next generation, a pitch reduction method is needed, mainly based on the spacer forming technique.

For example, patterns of conductor lines beyond lithographic resolution can be formed as follows. Base line patterns are lithographically defined and trimmed, linear spacers having a half pitch and a double number are formed on the sidewalls of the base line patterns, and then the base line patterns are removed, leaving the linear spacers as half-pitch line patterns beyond the lithographic resolution.

However, the requirement of increasing the memory density never stops.

SUMMARY OF THE INVENTION

Accordingly, this invention provides a method for forming quarter-pitch patterns.

This invention also provides a mask layer formed with the method.

The method for forming quarter-pitch patterns of this invention is described as follows. A lower resist layer and an upper resist layer are formed in sequence. The upper resist layer is defined into a plurality of first patterns. A coating that contains or generates a reactive material making the materials of the resist layers dissolvable in development is formed over the lower resist layer and the first patterns. The reactive material is diffused into a portion of each first pattern and into the portions of the lower resist layer between the first patterns to react with them. The coating is removed. A development step is performed to remove the portions of the first patterns and the portions of the lower resist layer, so that the lower resist layer is patterned into a plurality of second patterns. A plurality of spacers is formed on the sidewalls of the remaining first patterns and the sidewalls of the second patterns. The remaining first patterns are removed, and portions of the second patterns are removed using the spacers on the second patterns as a mask.

In an embodiment of the above method of this invention, the upper resist layer has a photosensitizing group and is photosensitive, and the lower resist layer has no photosensitizing group and is not photosensitive.

In an embodiment, the coating contains an acid as the reactive material. In another embodiment, the coating contains a thermal acid generator that generates an acid as the reactive material, and the generation and the diffusion of the acid utilizes a baking step.

The mask layer of this invention is disposed over a substrate, including a plurality of quarter-pitch patterns having a pitch substantially equal to a quarter of the lithography resolution-limited pitch.

In an embodiment of this invention, the quarter-pitch patterns include a plurality of first patterns arranged in a plurality of first pairs, and a plurality of second patterns arranged in a plurality of second pairs. Each of the first patterns includes a piece of a first material. Each of the second pattern includes a piece of a second material not in the first patterns, and a piece of the first material on the piece of the second material. The first pairs and the second pairs are arranged alternately.

In the method of this invention, because the first patterns defined from the upper resist layer is trimmed by the reaction with the reactive material and the development, and the lower resist layer is defined into second patterns due to the untrimmed first patterns, the reaction and the development, a plurality of stacks of one narrower first pattern on the middle of one wider second pattern is formed while the second patterns have a full pitch. Thereby, the spacers formed on the sidewalls of the first patterns and on the sidewalls of the second patterns can be quarter-pitch patterns.

In order to make the aforementioned and other objects, features and advantages of this invention comprehensible, a preferred embodiment accompanied with figures is described in detail below.

DESCRIPTION OF EMBODIMENTS

This invention is further explained with the following embodiments referring to the accompanying drawings, which are not intended to limit the scope of this invention.

FIGS. 1-8 illustrate, in a cross-sectional view, a method for forming quarter-pitch patterns according to an embodiment of this invention.

Figure 1:
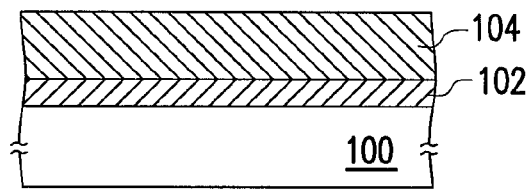
FIGS. 1-8 illustrate, in a cross-sectional view, a method for forming quarter-pitch patterns according to an embodiment of this invention, wherein FIG. 8 also illustrates a mask layer according to the embodiment of this invention.

Referring to FIG. 1, over a substrate 100, a lower resist layer 102 and an upper resist layer 104 are formed in sequence. The substrate 100 may have been formed with a film to be patterned thereon, and may be further formed with an anti-reflection coating (not shown) on the film to be patterned. The film may be a conductive film, such as a poly-Si film that is to be patterned into a plurality of word lines of a memory array.

In an embodiment, the upper resist layer 104 has a photosensitizing group and is photosensitive, while the lower resist layer 102 has no photosensitizing group and is not photosensitive. Thus, when the upper resist layer 104 is subjected to light exposure in the lithography process performed later, the lower resist layer 102 is not affected. The thickness of the lower resist layer 102 is within the range of 20-100 angstroms. The thickness of the upper resist layer 104 is within the range of 20-100 angstroms.

Figure 2:
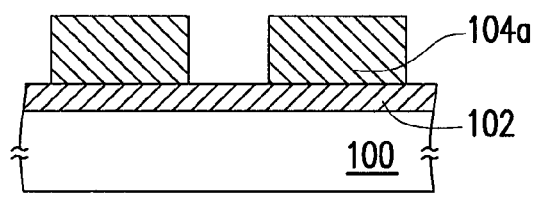

Referring to FIG. 2, the upper resist layer 104 is defining into a plurality of first patterns 104a, usually with an exposure step using a deep-UV light and a development step. The first patterns 104a are line patterns in cases where conductive lines are to be defined from the film to be patterned. The lower resist layer 102 is not affected by the exposure and development if it has no photosensitizing group and is not photosensitive.

Figure 3:
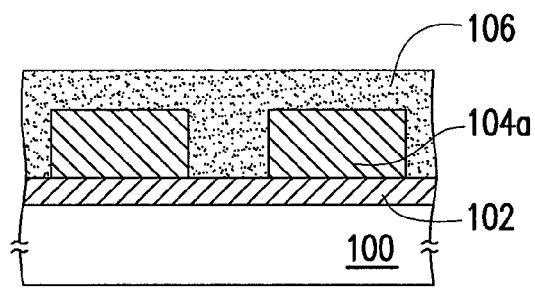

Referring to FIG. 3, a coating 106, which contains or generates a reactive material making the materials of the lower resist layer 102 and the upper resist layer 104 dissolvable in development, is formed over the lower resist layer 102 and the first patterns 104a. The coating 106 can include any base material that can contain the reactive material, or can contain a material capable of generating the reactive material, and will not impact the resist patterns. Examples of such base material of the coating 106 include sulfuric acid group and proton acid group.

The reactive material may be an acid, such as a protic acid. The protic acid may be sulfuric acid. In cases where the coating 106 generates a reactive material, the coating 106 may contain a thermal acid generator that generates an acid as the reactive material due to heating or a baking step. Examples of the thermal acid generator include proton acid group and sulfuric acid group.

Figure 4:
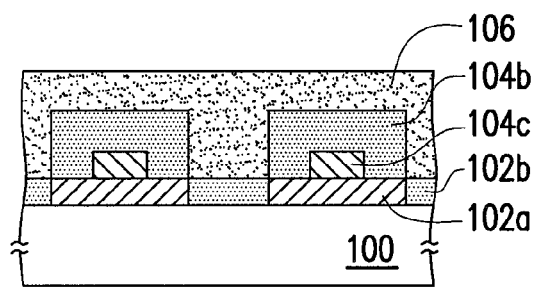

Referring to FIG. 4, the reactive material is diffused into a portion 104b of each first pattern 104a (=104b+104c) and into the portions 102b of the lower resist layer 102 between the first patterns 104a to react with them. The other portions 102a of the lower resist layer 102 are under the first pattern 104a. The diffusion usually utilizes a baking step. In cases where the coating 106 contains a thermal acid generator, both the generation and the diffusion of the acid usually utilizes a baking step.

Figure 5:
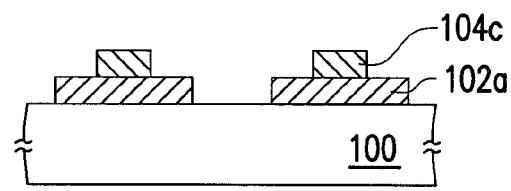

Referring to FIG. 5, after the coating 106 is removed, a development step is performed to remove the portions 104b of the first patterns 104a and the portions 102b of the lower resist layer 102, so that the lower resist layer 102 is patterned into a plurality of second patterns 102a. Each remaining first pattern 104c is narrower than each first pattern 104a (FIG. 2). The development step usually utilizes an alkaline solution, such as an aqueous solution of tetrabutylammonium hydroxide (TBAH) or tetramethylammonium hydroxide (TMAH).

Figure 6:
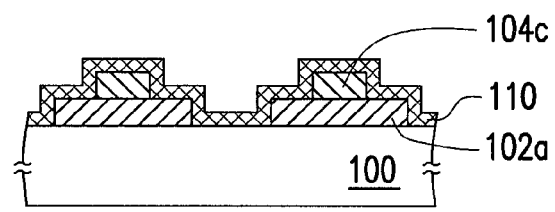

Referring to FIG. 6, a substantially conformal spacer material layer 110 is formed over the substrate 100, the remaining first patterns 104c and the second patterns 102a. The spacer material layer 110 may be formed through CVD, and may include gate oxide film, or gate poly film.

Figure 7:
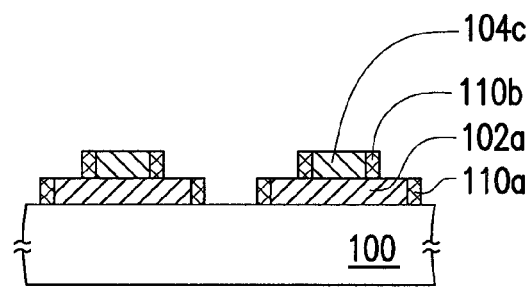

Referring to FIG. 7, the spacer material layer 110 is anisotropically etched to form a plurality of spacers 110a on the sidewalls of the second patterns 102a, and a plurality of spacers 110b on the sidewalls of the remaining first patterns 104c on the second patterns 102a.

Figure 8:
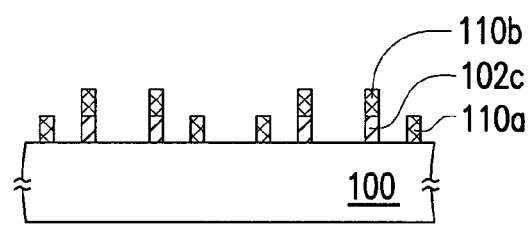

Referring to FIG. 8, the remaining first patterns 104c are removed, and portions of the second patterns 102a are also removed using the spacers 110b on the second patterns 102a as a mask, wherein the remaining second patterns 102c are under the spacers 110b. Thus, a plurality of patterns with a quarter pitch in average is obtained.

Thereafter, the film to be patterned (not shown) can be patterned with the spacers 110a and 110b as a mask to form target patterns. This should be well known to one of ordinary skill in the art and is therefore not described in details here.

FIG. 8 also illustrates a mask layer according to the embodiment of this invention.

Referring to FIG. 8, the mask layer is disposed over a substrate 100, including a plurality of quarter-pitch patterns (110a and 110b+102c) having a pitch substantially equal to a quarter of the lithography resolution-limited pitch. The quarter-pitch patterns include a plurality of first patterns 110a arranged in a plurality of first pairs, and a plurality of second patterns 110b+102c arranged in a plurality of second pairs. Each of the first patterns 110a comprises a piece of a first material 110a. Each of the second pattern 110b+102c comprises a piece of a second material 102c not in the first patterns 110a, and a piece of the first material 110b on the piece of the second material 102c. The first pairs and the second pairs are arranged alternately.

As mentioned in the descriptions for the method of this embodiment, the second material 102c may include a resist material. The first material 110a/c as the above-mentioned spacer material may include $SiO_2$.

As mentioned above, the first patterns defined from the upper resist layer is trimmed by the reaction with the reactive material and the development, and the lower resist layer is defined into second patterns due to the untrimmed first patterns, the reaction and the development, so that a plurality of stacks of one narrower first pattern on the middle of one wider second pattern is formed while the second patterns have a full pitch. Thereby, the spacers formed on the sidewalls of the first patterns and on the sidewalls of the second patterns can be quarter-pitch patterns.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method for forming quarter-pitch patterns, comprising:
    forming a lower resist layer and an upper resist layer in sequence;
    defining the upper resist layer into a plurality of first patterns;
    forming, over the lower resist layer and the first patterns, a coating that contains or generates a reactive material that makes materials of the lower resist layer and the upper resist layer dissolvable in development;
    diffusing the reactive material into a portion of each of the first patterns and into portions of the lower resist layer between the first patterns to react with them;
    removing the coating;
    performing a development step to remove the portions of the first patterns and the portions of the lower resist layer, so that the lower resist layer is patterned into a plurality of second patterns;
    forming a plurality of spacers on sidewalls of the remaining first patterns and sidewalls of the second patterns; and
    removing the remaining first patterns, and removing portions of the second patterns using the spacers on the second patterns as a mask.

2. The method of claim 1, wherein the upper resist layer has a photosensitizing group and is photosensitive, and the lower resist layer has no photosensitizing group and is not photosensitive.

3. The method of claim 1, wherein diffusing the reactive material utilizes a baking step.

4. The method of claim 1, wherein the coating contains an acid as the reactive material.

5. The method of claim 1, wherein the coating contains a thermal acid generator that generates an acid as the reactive material, and the generation and diffusion of the acid utilizes a baking step.

6. The method of claim 1, wherein forming the spacers comprises:
    forming a substantially conformal spacer material layer over the remaining first patterns and the second patterns; and
    anisotropically etching the spacer material layer.

7. The method of claim 1, wherein the spacers comprise $SiO_2$.

8. A mask layer disposed over a substrate, comprising a plurality of quarter-pitch patterns having a pitch substantially equal to a quarter of a lithography resolution-limited pitch, wherein the quarter-pitch patterns comprise a plurality of first patterns arranged in a plurality of first pairs, and a plurality of second patterns arranged in a plurality of second pairs, each of the first patterns comprises a piece of a first material, each of the second pattern comprises a piece of a second material not in the first patterns, and a piece of the first material on the piece of the second material, the second material comprises a resist material, and the first pairs and the second pairs are arranged alternately.

9. The mask layer of claim 8, wherein the first material comprises $SiO_2$.

\* \* \* \* \*